(12) United States Patent
Bhunia et al.

(10) Patent No.: US 7,319,343 B2
(45) Date of Patent: Jan. 15, 2008

(54) LOW POWER SCAN DESIGN AND DELAY FAULT TESTING TECHNIQUE USING FIRST LEVEL SUPPLY GATING

(75) Inventors: Swarup Bhunia, Midnapur (IN);
Hamid Mahmoodi, West Lafayette, IN (US); Arijit Raychowhury, Calcutta (IN); Saibal Mukhopadhyay, West Lafayette, IN (US); Kaushik Roy, West Lafayette, IN (US)

(73) Assignee: Purdue Research Foundation - Purdue University, West Lafayette, IN (US)

( * ) Notice: Subject to any disclaimer, the term of this patent is extended or adjusted under 35 U.S.C. 154(b) by 228 days.

(21) Appl. No.: 11/099,386

(22) Filed: Apr. 5, 2005

(65) Prior Publication Data

US 2006/0220679 A1 Oct. 5, 2006

(51) Int. Cl.
*H03K 19/173* (2006.01)
*G01R 31/28* (2006.01)

(52) U.S. Cl. ............................ 326/38; 326/16; 714/727

(58) Field of Classification Search .................. 326/16, 326/38, 57, 58; 714/726, 727
See application file for complete search history.

(56) References Cited

U.S. PATENT DOCUMENTS 6,577,157 B1* 6/2003 Cheung et al. ................ 326/38
2003/0218478 A1* 11/2003 Sani et al. ..................... 326/33

OTHER PUBLICATIONS

Xiaodong Zhang and Kaushik Roy, *Power Reduction in Test-Per-Scan BIST*, IEEE, 2000, no month.
Stefan Gerstendö rfer and Hans-Joachim Wunderlich, *Minimized Power Consumption for Scan-Based Bist*, pp. 77-84, ITC International Test Conference, IEEE, 1999, no month.
Kwang-Ting Cheng, Srinivas Devadas and Kurt Keutzer, *A Partial Enhanced-Scan Approach to Robust Delay-Fault Test Generation for Sequential Circuits*, pp. 403-410, International Test Conference 1991, IEEE 1991, no month.
Sumit DasGupta, Ronald G. Walther, Thomas W. Williams and Edward B. Eichelberger, *An Enhanced to LSSD and Some Applications of LSSD in Reliability, Availability and Serviceability*, pp. 289-291, Proceedings of FTCS-25, vol. III, IEEE, 1996, no month.

* cited by examiner

*Primary Examiner*—Daniel Chang
(74) *Attorney, Agent, or Firm*—Brinks Hofer Gilson & Lione

(57) ABSTRACT

A circuit includes an input block and a combinational logic block. The input block has reconfigurable latches that are connected serially during testing times such that an output of one of the latches is connected to an input of a successive latch. The latches are directly connected to first level gates of the combinational logic block. The combinational logic block contains switches that prevent the propagation of signals through the combinational logic block during testing times other than when a desired vector is loaded into the latches. The switches disconnect the power and/or ground from the first level gates. The switches further connect the outputs of the first level gates to power or ground, depending on the type of transistors used in the first level gates. The switches alternatively delay the output through a pair of inverters and resupply the output to itself if refreshing the output is desired.

51 Claims, 12 Drawing Sheets

US 7,319,343 B2

LOW POWER SCAN DESIGN AND DELAY FAULT TESTING TECHNIQUE USING FIRST LEVEL SUPPLY GATING

TECHNICAL FIELD

This application relates to circuits, and more particularly, to a circuit using supply gating for low power and/or delay fault testing.

BACKGROUND

Integrated circuits (or chips) are tested before shipping to the market as well as in the field, e.g. when the integrated circuit is provided in a product in the hands of a consumer. More specifically, different modules within the integrated circuits are tested. Field testing occurs at designated times, for example, when a microprocessor boots up. Before running an application, the microprocessor has to check the modules to make sure that everything is working properly. When microprocessors fail debugging may be used to understand from where the failure originated.

These tests include functional testing and testing for timing defects, or delay fault testing. In functional testing, input signals are provided to the input of the module and an output of the module is checked to determine whether the correct output signals are generated in response to the particular input. All possible input signals to the module are provided and the response is checked for each individual input signal. Functional testing is applied to all modules. In addition, certain modules in which timing problems may play a greater role undergo further testing to determine if timing defects are present. For example, the Arithmetic Logic Unit (ALU) of a microprocessor undergoes both functional testing and testing for timing defects.

Some chips are relatively simple and have few modules. Input signals for these chips may be supplied directly from off chip to the modules via the pins on the chips. In an integrated circuit with many different modules, for example a microprocessor however, there are a large number of modules whose inputs are not available directly off chip. These modules instead may be driven by some other logic block. For efficiency, it is better to test individual modules separately.

A shift register is used in order to provide flexibility in controlling the input state supplied to individual modules while using the minimal number of pins in the chip. An embodiment of the known circuit 100 containing a shift register is shown in FIG. 1. The circuit 100 has an input block 110, a holding block 120 and a combinational logic block 130. The input block 110 is connected to the combinational logic block 130 through the holding block 120. Another shift register (not shown) is present at the output side of the combination logic block 130.

During testing times, the input block 110 has a plurality of flip-flops 112 (also called latches) cascaded such that the output Q of one of the latches 112 is essentially connected to the input D of the adjacent latch 112. Under normal (non-testing) operation conditions, the latches are configured so that they are independent of each other, rather than being serially connected. A clock signal CLK supplied to the input block 110 is applied to each latch 112. The input block 110 also includes a multiplexer 114 for each latch 112. A timing control signal TC supplied to the input block 110 is applied to each multiplexer 114 to activate the multiplexer 114. Signals from the combinational logic block 130 are supplied to one input of the multiplexer 114. A Scan In signal is supplied to another input of the multiplexer 114 associated with the first latch 112 in the shift register. The output of the multiplexer 114 is connected to the input of the associated latch 112. The output Q of each latch 112 subsequent to the first latch is connected to the input of multiplexer 114 associated with the next latch 112. The signal from the output Q of the last latch 112 is taken as a scan out signal from the input block 110.

The latches 112 hold the signals (or state) applied to the input until a new state is applied and the latches 112 are again triggered to pass the state to the output. Because chip packages usually do not provide a large number of pins, the number of pins used for testing is minimized. Accordingly, the latches 112 are loaded with a desired pattern serially from one pin of the overall chip. Similarly, it takes the same amount of time to load the response data from the shift register of the combinational logic block 130. After loading a desired state, the response of the combinational logic block is then captured and analyzed to determine if it is correct. A relatively large combinational logic block 130 may have several thousand inputs. Thus, it may take several thousand clock cycles in which intermediate vectors are loaded to completely load a particular sequence (also called vector) into the latches 112 and test the output of the combinational logic block 130. So before reaching the desired state, the latches 112 have to go through thousands of unwanted states to reach the final, desired state. If the input block 110 and combinational logic block 130 were connected directly, the logic elements such as AND, OR, and inverter gates inside the combinational logic block 130 would dissipate power as the intermediate vectors were loaded due to internal switching in the logic elements. The switching is charging and discharging of capacitance internal to the logic elements.

Energy dissipation during testing increases the temperature of the chip in which the combinational logic block is disposed, which in turn detrimentally affects the reliability of the chip. Because the test vectors loaded into the input block are totally random, switching activity in the combinational logic block is at a maximum. On the other hand, the patterns applied to many combinational logic blocks tend to be correlated, reducing the total amount of switching in contrast to the exhaustive and totally random patterns applied during testing. Thus, the temperature obtained during testing may be larger than that obtained under normal operating conditions. Power dissipation due to testing also markedly decreases the battery lifetime of portable applications such as laptops or cell phones.

If the intermediate vectors are prevented from propagating through the combinational logic block, then the combinational logic block does not experience redundant switching before reaching final state. Accordingly, as shown in FIG. 1, a holding block 120 containing holding logic 122 is inserted between the input block 110 and the combinational logic block 130. The outputs of the latches 112 are connected to the holding logic 122 in the holding block 120. The holding block 120 isolates the combinational logic block 130 from the input block 110 between when one final vector and the next final vector is loaded into the input block 110. The holding block 120 passes the final vector for one clock cycle. Either the timing control signal TC or a separate hold signal HOLD can be supplied to the holding block 120 to permit the final vector to pass therethrough.

However, even if the functionality of the combinational logic block is correct, the combinational logic block may be slower than a target speed due to processing variations during fabrication, limitation of timing models and static timing analysis tools, or physical defects for example. Thus, although the combinational logic block works properly at the relatively low speed used during the functional testing, it does not provide proper outputs when operating at the target speed. Accordingly, for modules operating at the higher target speed, usually the frequency of the system, a timing test is used to determine whether there is any delay failure in the response when applying one particular vector and then next applying another particular vector at the target speed. The arrangement of FIG. 1 is used to hold the first vector while the second vector is loading. After the second vector is loaded, it is applied to the combinational logic block so that the response to the change between the first and second vectors can be obtained.

However, there is a significant amount of area, power, and delay overhead involved in inserting the holding block in the arrangement of FIG. 1. The holding block contains thousands of extra logic gates. These logic gates use a relatively large amount of extra die area on the substrate on which the integrated circuit is fabricated. Increasing the area concomitantly decreases the number of integrated circuits that are able to be fabricated on a wafer. The holding block also remains in the circuit during normal operation when the combinational logic block is not being tested. Switching from the flip-flops in the input block propagates through the holding block to reach the combinational logic block. Thus, the holding block also experiences switching during normal operation and therefore causes some power dissipation. As the circuit goes through testing once in a while but remains in the normal mode for a much larger proportion of time, decreasing power by a little in the normal mode is saves more power than using a little more power in the test mode. Finally, the holding block causes a delay in propagation of the signals from the input block to the combinational logic block.

BRIEF SUMMARY

By way of introduction only, in one embodiment a circuit includes an input block and a combinatorial logic block. The input block contains a plurality of latches. The latches are connected serially such that an output of one of the latches is connected to an input of a successive latch. The combinatorial logic block contains a plurality of logic gates. The logic gates include a set of first level gates connected to the input block. At least one of the first level gates contains: a first switch between the first level gate and either a supply voltage or ground and a switching circuit connected to an output of the first level gate, the switching circuit including a second switch.

In another embodiment, at least one of the first level gates contains means for providing a virtual ground and virtual power supply to the first level gate and means for delaying a signal from an output of the first level gate and resupplying the signal to the output of the first level gate at testing times other than when test signals are provided from the combinatorial logic block, i.e. the sleep mode.

In another embodiment, at least one of the first level gates contains means for providing a virtual ground or virtual power supply to the first level gate and second means for providing the virtual ground or virtual power supply to an output of the first level gate.

In another embodiment, at least one of the first level gates contains means for preventing propagation of input signals from the input block through the combinatorial logic block.

In another embodiment, a system for testing a circuit includes the input block, a combinatorial logic block, a clock circuit, a timing control circuit, and a detector. The combinatorial logic block contains a plurality of logic gates that include a set of first level gates connected to the input block. A plurality of the first level gates has at least one first switch through which the first level gates are disconnected from a supply voltage and ground. Each of the first level gates has a switching circuit connected to an output of the first level gate and including a second switch. The clock circuit supplies a clock signal to the input block. The timing control circuit supplies a control signal to the input block and the combinatorial logic block. The control signal controls the first and second switches. The detector captures an output from the combinatorial logic block in response to a predetermined sequence of signals supplied from the latches to the combinatorial logic block.

In another embodiment a method of testing a circuit includes: sequentially loading a sequence of signals to a plurality of latches in an input block; providing the sequence to first level gates in a combinatorial logic block from the input block once the sequence is completely loaded into the latches; in the sleep mode, disconnecting at least one first level gate of the combinatorial logic block from at least one of ground and a power supply voltage while providing a predetermined voltage to an output of the first level gate.

In another embodiment a method of testing a circuit includes: sequentially loading a sequence of signals to a plurality of latches in an input block; providing the sequence to first level gates in a combinatorial logic block directly from the input block once the sequence is completely loaded into the latches; preventing propagation through the combinatorial logic block of input signals from the input block before the sequence is completely loaded; and capturing output signals from the combinatorial logic block once the sequence is provided to the first level gates.

It is to be understood that both the foregoing general description and the following detailed description of the present invention are merely exemplary and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION

Additions to a circuit to be tested are provided that reduce power dissipation, substrate area and/or delay of the circuit. The gates (first level gates) of the combinational logic block to be tested are directly connected to an input block. The first level gates have multiple switches that disconnect the first level gate from the power supply voltage and/or ground in a hold mode of a testing mode. The output nodes of the first level gates are also connected to the power supply voltage and/or ground in the hold mode. Alternatively, the output nodes are each latched to themselves such that the output is refreshed in the hold mode. The first level gates are connected to the power supply voltage and ground while the output nodes are responsive to the signals supplied to the inputs of the first level gates. The additional circuitry thus prevents propagation of switching though the combinational logic block during the hold times.

Figure 2:
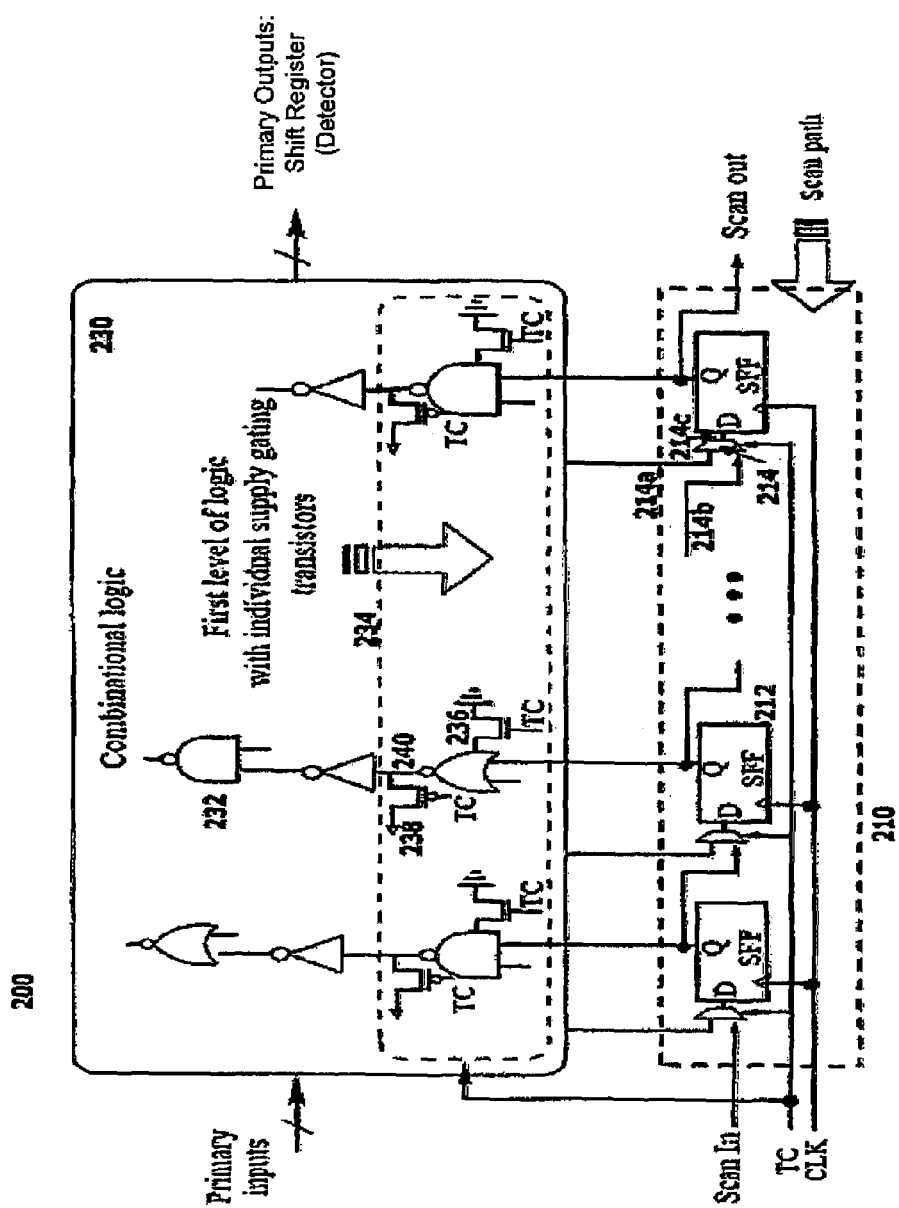
FIG. 2 is a circuit according to a first embodiment.

FIG. 2 illustrates a first embodiment of a circuit. The circuit 200 contains an input block 210 and a combinational logic block 230. The input block 210 is directly connected to the combinational logic block 230. That is, extra logic gates for blocking the signals to the combinational logic block 230 are not present between the input block 210 and the combinational logic block 230. Another shift register is present at the output side of the combination logic block 230.

During testing times, the input block 210 has a plurality of flip-flops (latches) 212 cascaded such that the output Q of one of the latches 212 is essentially connected to the input D of the adjacent latch 212. In normal (non-testing) operation mode, the latches are reconfigured so that they are independent of each other, rather than being serially connected. A clock signal CLK supplied to the input block 210 is applied to each latch 212. The input block 210 also includes a multiplexer 214 for each latch. A timing control signal TC supplied to the input block 210 is applied to each multiplexer 214 to activate the multiplexer 214. Signals from the combinational logic block 230 are supplied to one input 214a of the multiplexer 214. A Scan In signal is supplied to another input 214b of the multiplexer 214 associated with the first latch 212 in the shift register. The output 214c of the multiplexer 214 is connected to the input D of the associated latch 212. The output Q of each latch 212 subsequent to the first latch is connected to the input 214b of multiplexer 214 associated with the next latch 212. The signal from the output Q of the last latch 212 is taken as a scan out signal from the input block 210.

The latches 212 hold the state applied to the input D until the latches are triggered to pass the state to the output Q. The latches 212 are loaded with a desired pattern serially from one pin of the overall chip. Similarly, it takes the same amount of time to load the response data from the shift register of the combinational logic block 230. After loading a desired state (called the final vector), the response of the combinational logic block is then captured and then analyzed to determine if it is correct.

The combinational logic block 230 contains logic gates 232. The input block 210 and combinational logic block 230 are directly connected. More specifically, the outputs Q of the flip-flops 212 are directly connected to first level gates 234 of the combinational logic block 230. The first level gates 234 can be NAND gates, NOR gates, inverters, XOR gates or any other logic gate used in the combinational logic block 230. The first level gates 234 can include NMOS and/or PMOS transistors or bipolar junction transistors (BJTs), for example. Each of the logic gates 232 are connected a supply voltage VDD and ground.

A first switch 236 is connected between each of the first level gates 234 and either the supply voltage VDD or ground. A second switch 238 is similarly connected between the output 240 of each of the first level gates 234 and either the supply voltage VDD or ground. Each pair of first and second switches 236 and 238 connected to the same first level gate 234 supply different voltages to the first level gate 234. The first and second switches 236 and 238 are, for example, NMOS or PMOS transistors or BJTs. In the embodiment shown, one of the first and second switches 236 and 238 is an NMOS transistor while the other is a PMOS transistor. In this case, the first switch 236 thus may be called a supply gating transistor. The first and second switches 236 and 238 are controlled by the timing control signal TC. Accordingly, the first and second switches 236 and 238 are active at different times and inactive at different times. More specifically, the first switch 236 is open (i.e. the power supply/ground is disconnected from the first level gate 234) and the second switch 238 is closed (i.e. the power supply/ground is connected to the output 240 of the first level gate 234) at testing times other than when the final vector is supplied to the combinatorial logic block 230, i.e. in a hold mode. When the final vector is supplied to the combinatorial logic block 230 and during normal operation, the first switch 236 is closed and the second switch 238 is open.

Alternatively, both of the first and second switches 236 and 238 may be formed from the same type of switch, for example, an NMOS transistor, but controlled by the timing control signal TC and the complement of the timing control signal TC. Thus, the first and second switches 236 and 238 are active at different times and inactive at different times.

Figure 3:
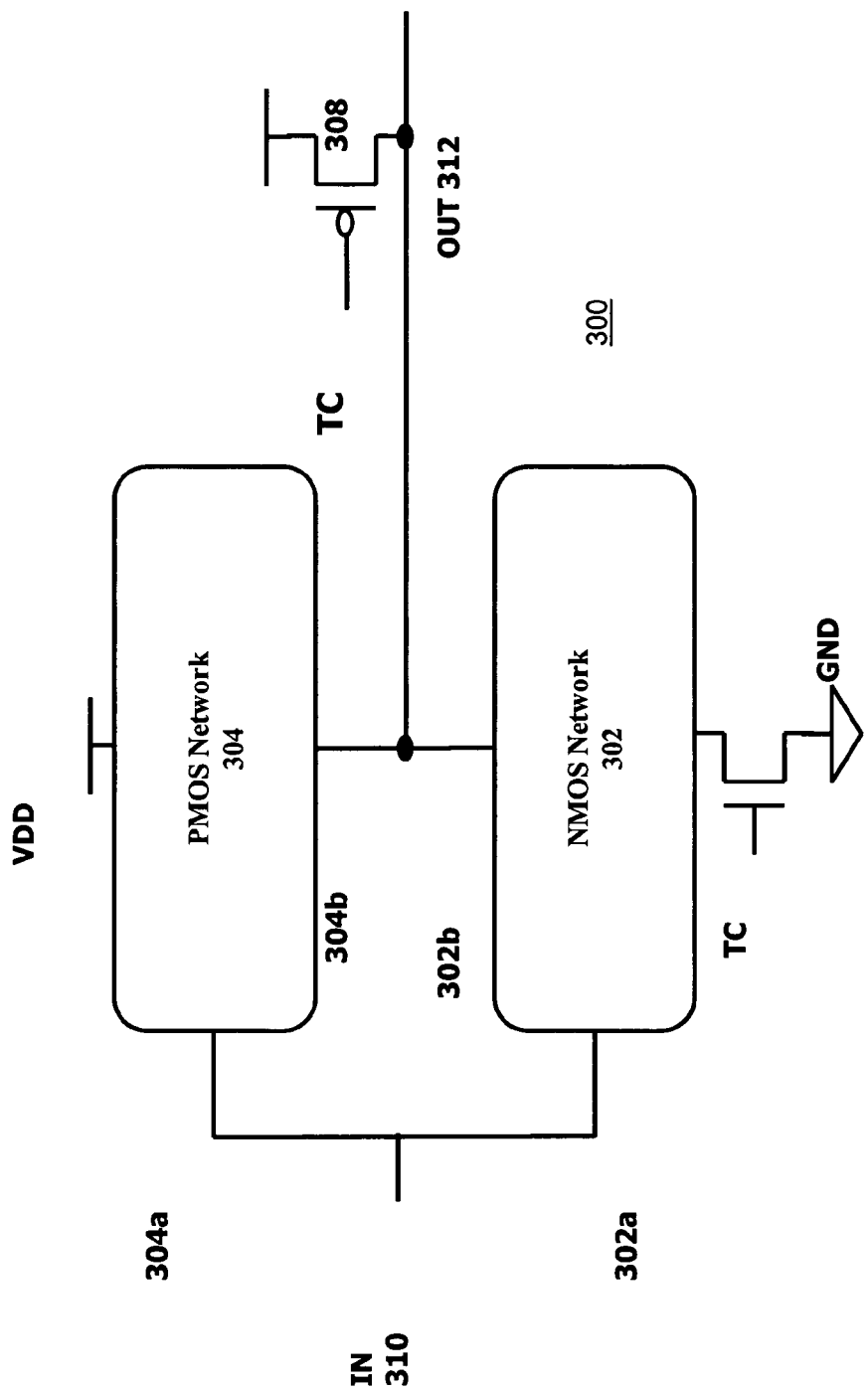
FIG. 3 is a first embodiment of a first level gate.
Figure 4:
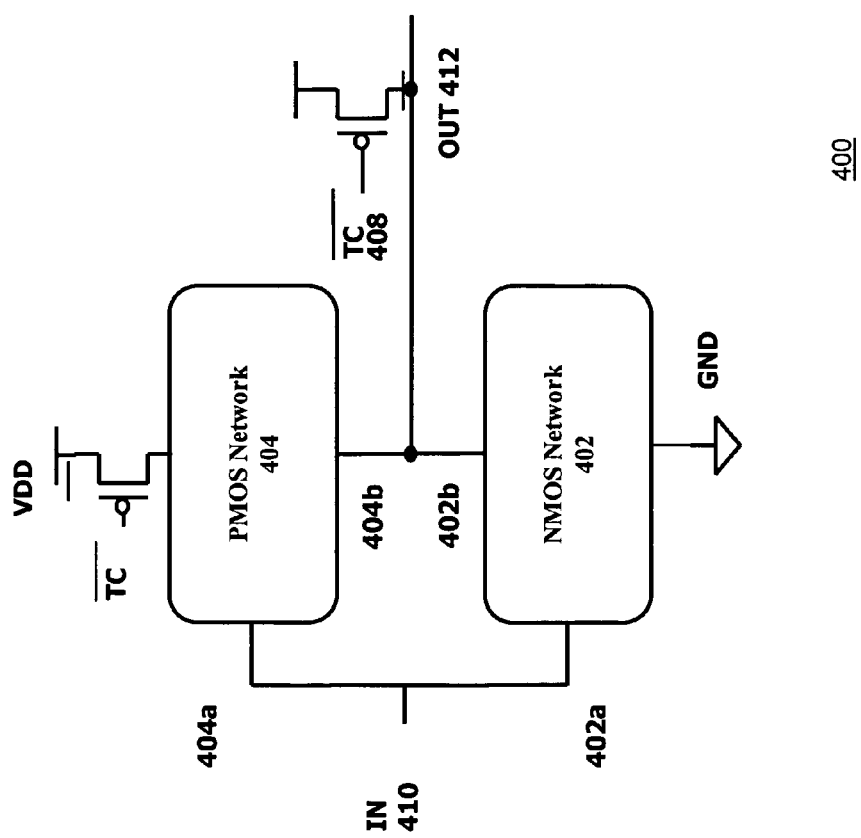
FIG. 4 is a second embodiment of a first level gate.

Diagrams of one of the first level gates of FIG. 2 are shown in FIGS. 3 and 4. FIG. 3 illustrates a first level gate 300 containing an NMOS network 302 and a PMOS network 304. The network contains one or more devices fabricated using the type of MOS indicated. The outputs 302b and 304b from the NMOS and PMOS networks 302 and 304 are connected together and supplied as an output 312 of the first level gate 300. An input signal from the input block (not shown) is supplied to an input 310 of the first level gate 300 and split to inputs 302a and 304a of both the NMOS and PMOS networks 302 and 304. The PMOS network 304 is directly connected to the supply voltage VDD. The NMOS network 302 is connected to ground through the first switch 306. The output 312 of the first level gate 300 is connected to the supply voltage VDD through the second switch 308. The first and second switches 306 and 308 are controlled by the timing control signal TC. In the embodiment shown, the first switch 306 is an NMOS transistor and the second switch 308 is a PMOS transistor. As above, the first switch 306 is open and the second switch 308 is closed in hold mode. Thus, the first switch 306 produces a virtual ground at the node between the first switch 306 and the NMOS network 302 and the output 312 of the first level gate 300 is pulled up to the supply voltage by the second switch 308 in the hold mode.

Similarly, FIG. 4 illustrates a first level gate 400 containing an NMOS network 402 and a PMOS network 404. The outputs 402b and 404b from the NMOS and PMOS networks 402 and 404 are connected together and supplied as an output 412 of the first level gate 400. An input signal from the input block (not shown) is supplied to an input 410 of the first level gate 400 and split to inputs 402a and 404a of both the NMOS and PMOS networks 402 and 404. The NMOS network 402 is directly connected to ground. The PMOS network 404 is connected to the supply voltage VDD through the first switch 406. The output 412 of the first level gate 400 is connected to ground through the second switch 408. The first and second switches 406 and 408 are controlled by the timing control signal TC. In the embodiment shown, the first switch 406 is a PMOS transistor and the second switch 408 is an NMOS transistor. As above, the first switch 406 is open and the second switch 408 is closed in the hold mode. Thus, the first switch 406 produces a virtual power supply at the node between the first switch 406 and the PMOS network 404 and the output 412 of the first level gate 400 is grounded by the second switch 408 in the hold mode.

In either FIG. 3 or 4, as the voltage to the NMOS network or the PMOS network is disconnected during the hold mode, a transition at the input of the first level gate does not propagate to the output of the first level gate. As the ground or supply voltage is disconnected from the first level gate during the hold mode, the output of the first level gate is floating. However, because the output of the first level gate is floating, a sufficient amount of noise can change the output state, i.e. cause a transition, which then propagates through the remainder of the combinational logic block. Alternatively, noise at the output of the first level gate can change the output from 0 V (ground) or 1 V (the power supply voltage) to some intermediate voltage, for example 0.5V. The intermediate voltage is supplied to the input of the logic gate to which the output of the first level gate is connected. This intermediate voltage causes short circuit current to flow as neither the NMOS nor PMOS networks of the next logic gate are completely off. Instead the networks are both partially on, resulting in a direct path from the supply voltage to ground, thereby permitting continuous current flow that dissipates extra power.

Accordingly, to prevent the output of the first level gate from floating, the second switch forces the state of the first level gate to ground or the power supply voltage. As shown in FIGS. 3 and 4, the transistors that comprise the switches are of different types and connected to different voltages (the supply voltage VDD or ground). In FIG. 3, the NMOS network is inactive because the ground path is disconnected. However, the PMOS network remains connected to the supply voltage. If the output of the PMOS network is connected to the supply voltage VDD, even if the PMOS network is active, no current path is present between the supply voltage VDD and ground. For example, if the PMOS network is a single transistor, the source and drain of the transistor are both at the same voltage (VDD) so no current will flow independent of the voltage supplied to the gate of the transistor.

Similarly, in FIG. 4, the PMOS network is inactive because the path to the supply voltage VDD is disconnected. However, the NMOS network remains connected to ground. If the output of the NMOS network is connected to ground, even if the NMOS network is active, no current path is present between the supply voltage VDD and ground. For example, if the NMOS network is a single transistor, the source and drain of the transistor are both at the same voltage (ground) so no current will flow independent of the voltage supplied to the gate of the transistor.

Using only a small NMOS or PMOS transistor connected to the output of the first level gate and a small NMOS or PMOS supply gating transistor minimizes the area and power used by these transistors. When the final vector is supplied to the combinational logic block and during normal operation the NMOS network is connected to ground, the PMOS network is connected to the supply voltage VDD and the output of the first level gate is responsive to the input to the first level gate. This improves the area and power overhead as only one supply gating transistor and one output transistor are used per first level gate. Similarly, the delay overhead is reduced as the input block and the combinational logic block are directly connected.

Figure 5:
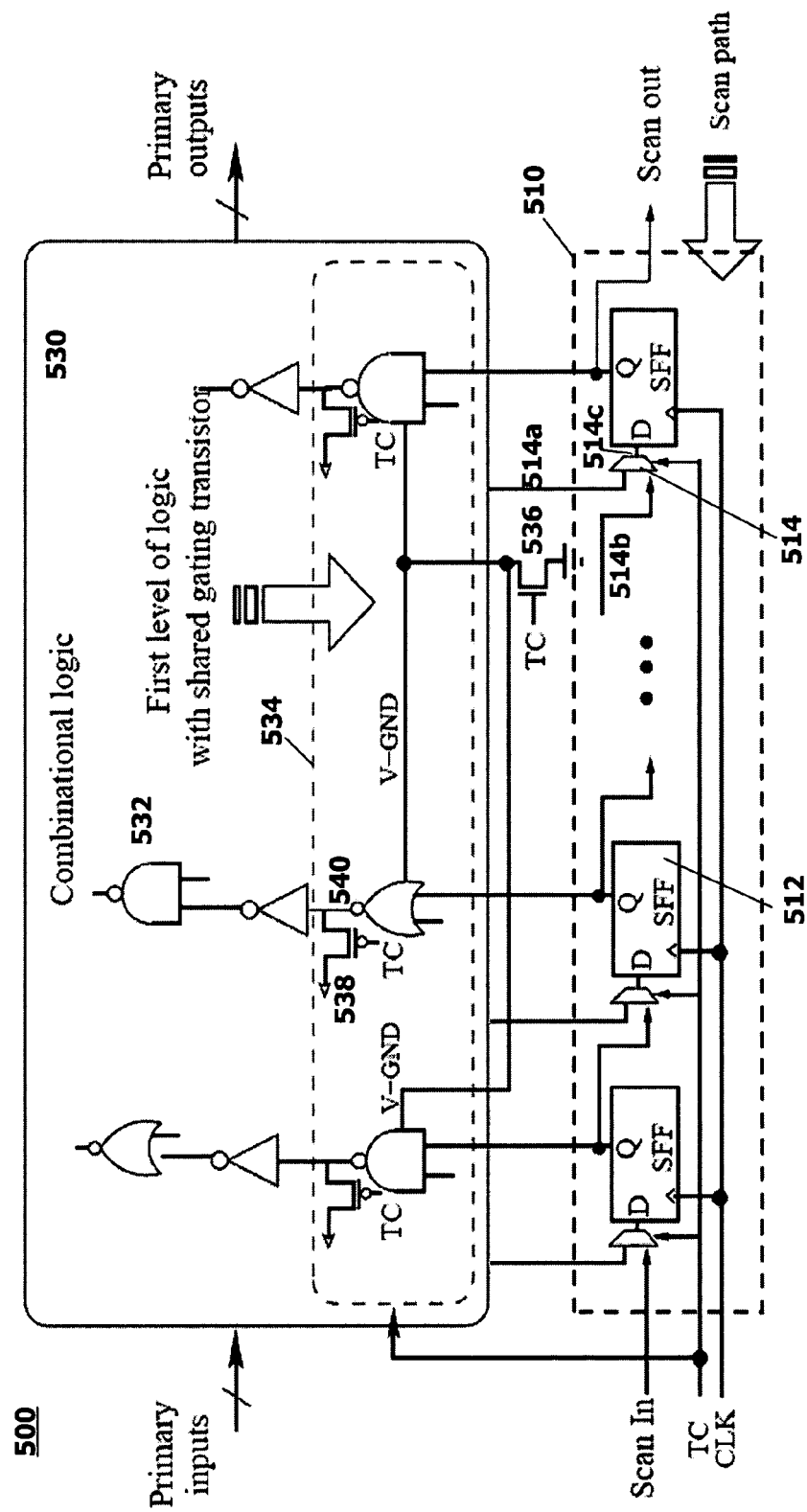
FIG. 5 is a circuit according to a second embodiment.

In another embodiment, shown in FIG. 5, in order to further minimize the area, delay, and power overhead, the supply gating transistor can be shared among several first level gates. Similar to FIG. 2, the circuit 500 of FIG. 5 contains an input block 510 and a combinational logic block 530. The input block 510 is directly connected to the combinational logic block 530. Another shift register (not shown) is present at the output side of the combination logic block 530.

During testing times, the input block 510 has a plurality of flip-flops (latches) 512 cascaded such that the output Q of one of the latches 512 is essentially connected to the input D of the adjacent latch 512. In normal (non-testing) operation mode, the latches are reconfigured so that they are independent of each other, rather than being serially connected. A clock signal CLK supplied to the input block 510 is applied to each latch 512. The input block 510 also includes a multiplexer 514 for each latch. A timing control signal TC supplied to the input block 510 is applied to each multiplexer 514 to activate the multiplexer 514. Signals from the combinational logic block 530 are supplied to one input 514*a* of the multiplexer 514. A Scan In signal is supplied to another input 514*b* of the multiplexer 514 associated with the first latch 512 in the shift register. The output 514*c* of the multiplexer 514 is connected to the input of the associated latch 512. The output Q of each latch 512 subsequent to the first latch is connected to the input 514*b* of multiplexer 514 associated with the next latch 512. The signal from the output Q of the last latch 512 is taken as a scan out signal from the input block 510.

The latches 512 hold the state applied to the input D until the latches are triggered to pass the state to the output Q. The latches 512 are loaded with a desired pattern serially from one pin of the overall chip. After loading the final vector, the response of the combinational logic block is then captured and analyzed to determine if it is correct.

The combinational logic block 530 contains logic gates 532. The input block 510 and combinational logic block 530 are directly connected. More specifically, the outputs Q of the flip-flops 512 are directly connected to first level gates 534 of the combinational logic block 530. The first level gates 534 can be NAND gates, NOR gates, inverters, XOR gates or any other logic gate used in the combinational logic block 530. The first level gates 534 can include NMOS and/or PMOS transistors or bipolar junction transistors (BJTs), for example. Each of the logic gates 532 are connected a supply voltage VDD and ground.

A first switch 536 is connected between each of the first level gates 532 and either the supply voltage VDD or ground. A second switch 538 is similarly connected between the output 540 of each of the first level gates 532 and either the supply voltage VDD or ground. Each pair of first and second switches 534 and 536 connected to the same first level gate 532 supply different voltages to the first level gate 532. The first and second switches 536 and 538 are, for example, NMOS or PMOS transistors or BJTs. One of the first and second switches 536 and 538 is an NMOS transistor while the other is a PMOS transistor. The first and second switches 536 and 538 are controlled by the timing control signal TC. Accordingly, the first switch 536 is open (i.e. the power supply/ground is disconnected from the first level gate 532) and the second switch 538 is closed (i.e. the power supply/ground is connected to the output 540 of the first level gate 532) in the hold mode. When the final vector is supplied to the combinatorial logic block 530 and during normal operation, the first switch 536 is closed and the second switch 538 is open.

Unlike the embodiment of FIG. 2, however, in the embodiment of FIG. 5, a plurality of the first level gates 534 are connected together so that a single supply gating transistor 536 is connected between ground and multiple first level gates 532. The area of the supply gating transistor 536 increases as the number of first level gates 532 connected to the supply gating transistor 536 increases because the amount of current supplied by supply gating transistor 536 increases in the normal operation or when the final vector is loaded. For typical patterns during normal operation, not all of the first level gates conduct current at the same time. Statistically, about half of them switch and half do not switch in when a new vector is loaded into the flip-flops, which are, as above, reconfigured to be independent in normal operation. Thus, the size of the shared supply gating transistor is less than the sum of the sizes of individual supply gating transistor used if each first level gate were connected by a separate supply gating transistor. Thus, sharing reduces the area overhead. When using one or more shared supply gating transistors, the virtual ground formed by the supply gating transistor is routed through the substrate on which the circuit is fabricated, resulting in an additional interconnect (virtual ground node) being fabricated.

Although either or both NMOS and PMOS networks may be used to fabricate the logic gates in the combinational logic block, NMOS networks are generally used as NMOS devices are faster than PMOS devices having the same area. While this is generally the case, using both NMOS and PMOS networks may be desirable. Switching power, the energy that is dissipated due to switching, is usually the dominating source of power consumption. However, other energy dissipation components such as leakage also exist because the transistors are not ideal. Leakage has become increasingly significant as the transistors that form the logic gates with aggressive scaling down to smaller and smaller sizes, notably the current sub-100 nm technologies. The leakage of the logic gates is a function of the state of the logic gates. When the combinational logic block is idle during testing, i.e. when in the hold mode or when intermediate vectors are loaded, the logic gates are placed in the state that causes minimum leakage. This state can be predicted ahead of time, in which case a choice between ground gating and VDD gating for individual first level gates can be made to put the circuit in the state for leakage minimization. Of course, the combinational logic block will be slightly slower than if all NMOS devices are used or will use a little more area because PMOS devices are larger if the same speed as NMOS devices is desired.

Figure 6:
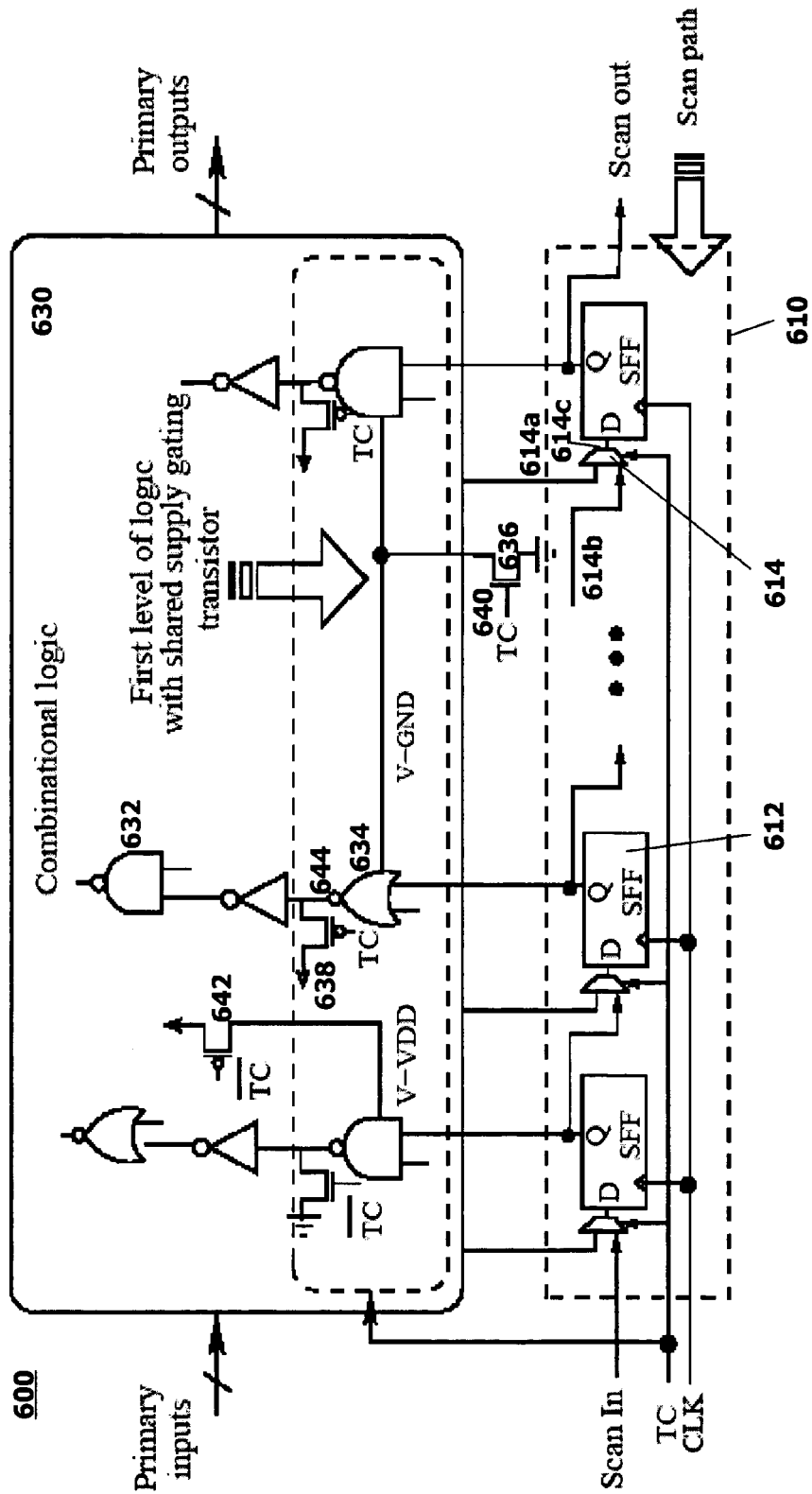
FIG. 6 is a circuit according to a third embodiment.

An embodiment in which both NMOS and PMOS networks are present is shown in FIG. 6. Similar to FIG. 5, the circuit 600 of FIG. 6 contains an input block 610 and a combinational logic block 630. The input block 610 is directly connected to the combinational logic block 630. Another shift register (not shown) is present at the output side of the combination logic block 630.

During testing times, the input block 610 has a plurality of flip-flops (latches) 612 cascaded such that the output Q of one of the latches 612 is essentially connected to the input D of the adjacent latch 612. In normal (non-testing) operation mode, the latches are reconfigured so that they are independent of each other, rather than being serially connected. A clock signal CLK supplied to the input block 610 is applied to each latch 612. The input block 610 also includes a multiplexer 614 for each latch. A timing control signal TC supplied to the input block 610 is applied to each multiplexer 614 to activate the multiplexer 614. Signals from the combinational logic block 630 are supplied to one input 614a of the multiplexer 614. A Scan In signal is supplied to another input 614b of the multiplexer 614 associated with the first latch 612 in the shift register. The output 614c of the multiplexer 614 is connected to the input D of the associated latch 612. The output Q of each latch 612 subsequent to the first latch is connected to the input 614b of multiplexer 614 associated with the next latch 612. The signal from the output Q of the last latch 612 is taken as a scan out signal from the input block 610.

The latches 612 hold the state applied to the input D until the latches are triggered to pass the state to the output Q. The latches 612 are loaded with a desired pattern serially from one pin of the overall chip. After loading the final vector, the response of the combinational logic block is then captured and analyzed to determine if it is correct.

The combinational logic block 630 contains logic gates 632. The input block 610 and combinational logic block 630 are directly connected. More specifically, the outputs Q of the flip-flops 612 are directly connected to first level gates 634 of the combinational logic block 630. The first level gates 634 can be NAND gates, NOR gates, inverters, XOR gates or any other logic gate used in the combinational logic block 630. The first level gates 634 can include NMOS and/or PMOS transistors or bipolar junction transistors (BJTs), for example. Each of the logic gates 632 are connected a supply voltage VDD and ground.

A first switch 636 is connected between each of the first level gates 632 and either the supply voltage VDD or ground. A second switch 638 is similarly connected between the output 644 of each of the first level gates 634 and either the supply voltage VDD or ground. Each pair of first and second switches 636 and 638 connected to the same first level gate 634 supply different voltages to the first level gate 634. The first and second switches 636 and 638 are, for example, NMOS or PMOS transistors or BJTs. One of the first and second switches 636 and 638 is an NMOS transistor while the other is a PMOS transistor. The first and second switches 636 and 638 are controlled by the timing control signal TC. Accordingly, the first switch 636 is open (i.e. the power supply/ground is disconnected from the first level gate 634) and the second switch 638 is closed (i.e. the power supply/ground is connected to the output 644 of the first level gate 634) in the hold mode. When the final vector is supplied to the combinatorial logic block 630 and during normal operation, the first switch 636 is closed and the second switch 638 is open.

In the embodiment of FIG. 6, both NMOS and PMOS networks are present. The first switch 636 is either a NMOS supply gating transistor 640 or a PMOS supply gating transistor 642. A plurality of the NMOS first level gates 634 are connected together so that a single NMOS supply gating transistor 640 is connected between ground and multiple NMOS first level gates 634. Similarly, a plurality of the PMOS first level gates 634 are connected together so that a single PMOS supply gating transistor 642 is connected between the supply voltage VDD and multiple PMOS first level gates 634. The timing control signal TC is supplied to the gate of the NMOS supply gating transistor 640 while the complement of the timing control signal TC is supplied to the gate of the PMOS supply gating transistor 642. As discussed above, the embodiment of FIG. 6 may decrease the leakage current at the expense of area and/or response speed.

Figure 7:
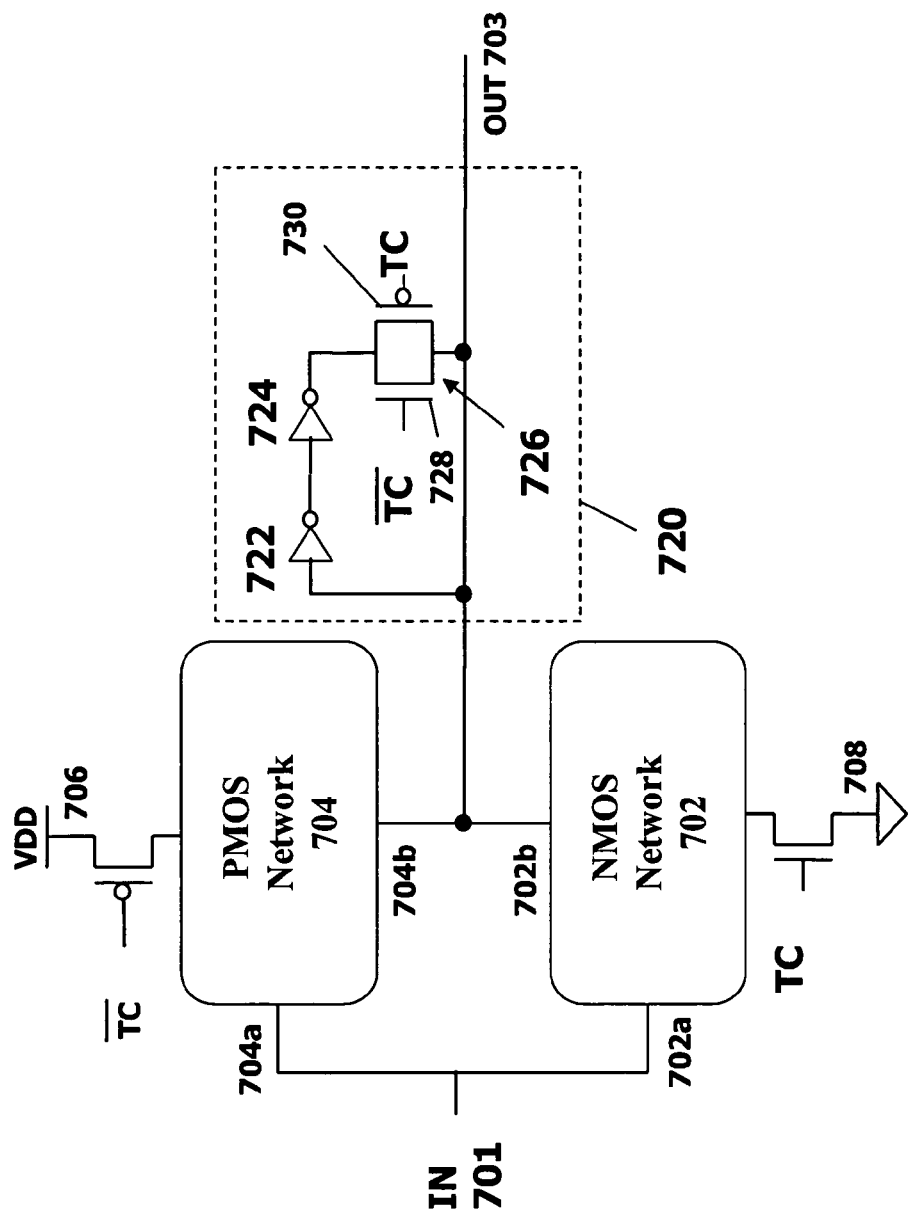
FIG. 7 is a third embodiment of a first level gate.

In another embodiment, supply gating switches can be used to disconnect the NMOS and PMOS networks (if both are present) from the supply voltage and ground or the NMOS network or PMOS network from the supply voltage and ground if only one is present. FIG. 7 shows an embodiment in which a first level gate 700 contains a PMOS network 702 and an NMOS network 704. The PMOS network 702 is connected to the power supply voltage through a first switch 706 and the NMOS network is connected to ground through a second switch 708, respectively. The first switch 706 is a PMOS transistor and the second switch 708 is an NMOS transistor, for example. A timing control signal TC is applied to the gate of the NMOS transistor 708 and the complement of the timing control signal TC is applied to the gate of the PMOS transistor 706, so that both the PMOS and NMOS transistors 706 and 708 are active at the same time. The outputs of the PMOS and NMOS networks 702 and 704 are connected and supplied as an output of the first level gate 700.

As shown in FIG. 7, a switching circuit 720, also referred to as a delay loop, permits the state of the output 703 of the first level gate 700 to be maintained during testing in the hold mode while an intermediate vector is being loaded. Unlike the previous embodiments, in which the output states of the first level gates are set to the same definitive value when the intermediate vector is loaded, in the embodiment of FIG. 7, the output state during this time period depends on the output states when the last final vector was supplied to the first level gates.

The delay loop 720 is connected to the output 703 of the first level gate 700. The delay loop 720 contains a delay formed by a pair of back-to-back inverters 722 and 724 and a switch 726 (or other latch element) disposed between one of the inverters 722 and 724 and the output. The switch 726 may be on either the input or output side of the pair of inverters 722 and 724. The switch 726 contains a PMOS transistor 728 and an NMOS transistor 730. The gate of the PMOS transistor 728 is controlled by the timing control signal TC and the gate of the NMOS transistor 730 is controlled by the complement timing control signal TC. Thus, the transistors 728 and 730 in the switch 726 are active at the same time and the supply gating transistors 706 and 708 are active at the opposite time as the transistors 728 and 730 in the switch 726. The delay loop 720 refreshes the output signal when the loop is connected at both ends to the output 703. That is, the back-to-back inverters 722 and 724 delay the signal on the output of the first level gate 700 and resupply the signal to the output 703 when the switch 726 is closed. When the delay loop 720 is open and supply gating transistors 706 and 708 are closed, the output 703 of the first level gate 700 is responsive to the input 701.

Without the delay loop 720, the signal at the output of the first level gate 700 is only weakly held when the supply gating transistors 706 and 708 are open. Thus, as above, noise can change the signal on the output of the first level gate 700, the signal on the output of subsequent gates, and/or cause leakage due to a current path between the supply voltage and ground being present. Minimum sized inverters are large enough to be able to hold the state of the output node in the hold mode despite the presence of leakage and noise. The use of minimum sized transistors for the latch element reduces additionally loading on the outputs of first level gates, resulting in minimal delay and power penalty. The size of the supply gating transistors can be optimized for delay under a given area constraint. Moreover, with the delay loop 720 present, disconnection of both the supply voltage and ground from the first level gate 700 eliminates the possibility of either NMOS network 702 or PMOS network 704 being turned on inadvertently due to a particular input signal being applied to the input 701 of the first level gate 700 (and thereby perhaps changing the state of the output 703 of the first level gate 700).

Of course any delay element(s) such as an even number of inverters may be used to provide the output signal back to the output. The switch 726 is thus closed to retain the state of the first level gate 700 when the intermediate vectors are supplied to the input block.

Figure 8:
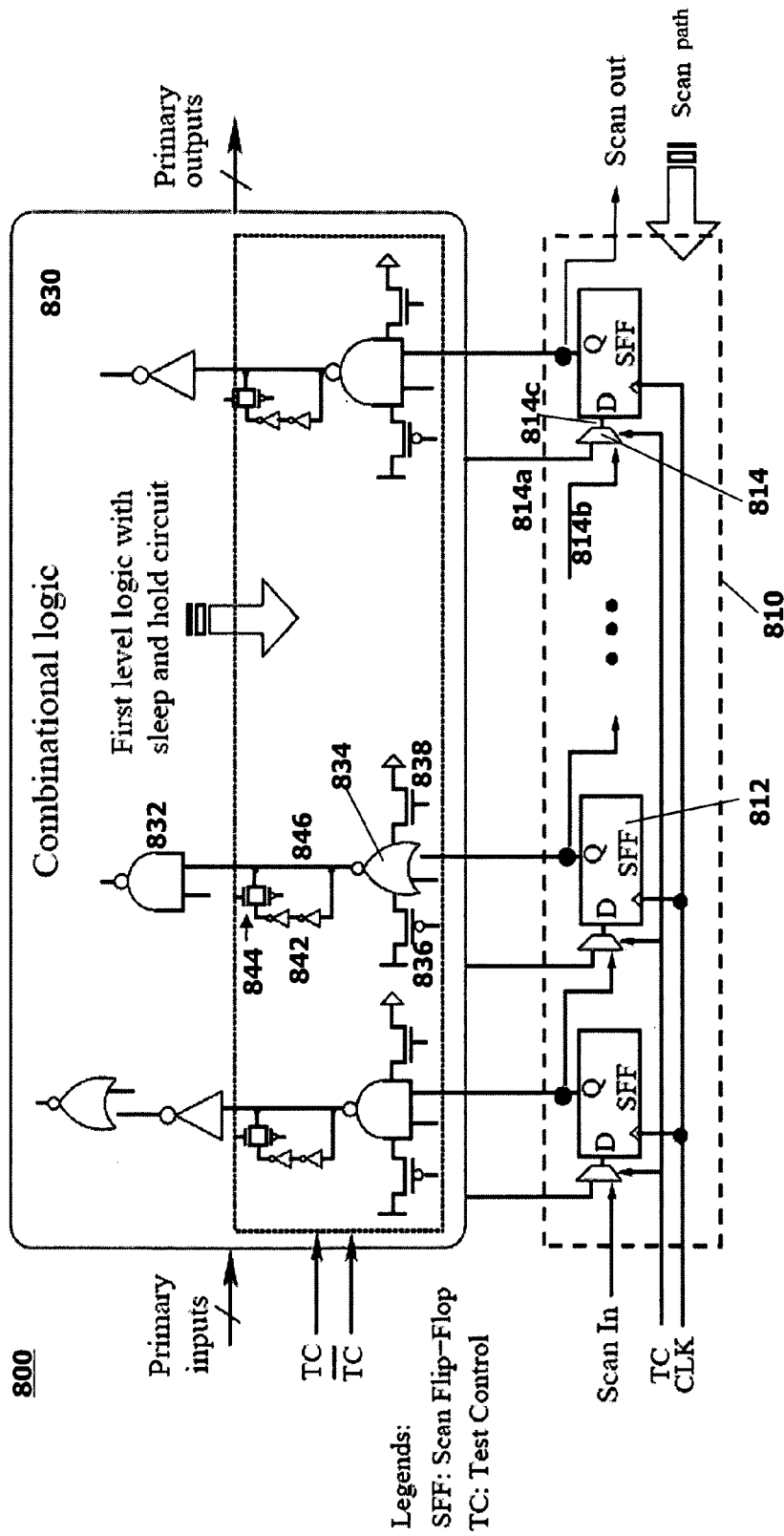
FIG. 8 is a circuit according to a fourth embodiment.

A circuit similar to the circuit of FIG. 2 but in which the switching circuit is used in the combinational logic block is shown in FIG. 8. As illustrated, the circuit 800 contains an input block 810 and a combinational logic block 830. The input block 810 is directly connected to the combinational logic block 830. That is, the extra logic gates of the holding block for blocking the signals to the combinational logic block 830 are not present between the input block 810 and the combinational logic block 830. Another shift register (not shown) is present at the output side of the combination logic block 830.

During testing times, the input block 810 has a plurality of flip-flops (latches) 812 cascaded such that the output Q of one of the latches 812 is essentially connected to the input D of the adjacent latch 812. In normal (non-testing) operation mode, the latches are reconfigured so that they are independent of each other, rather than being serially connected. A clock signal CLK supplied to the input block 810 is applied to each latch 812. The input block 810 also includes a multiplexer 814 for each latch. A timing control signal TC supplied to the input block 810 is applied to each multiplexer 814 to activate the multiplexer 814. Signals from the combinational logic block 830 are supplied to one input 814*a* of the multiplexer 814. A Scan In signal is supplied to another input 814*b* of the multiplexer 814 associated with the first latch 812 in the shift register. The output Q of the multiplexer 814 is connected to the input D of the associated latch 812. The output Q of each latch 812 subsequent to the first latch is connected to the input D of multiplexer 814 associated with the next latch 812. The signal from the output Q of the last latch 812 is taken as a scan out signal from the input block 810.

The latches 812 hold the state applied to the input D until the latches are triggered to pass the state to the output Q. The latches 812 are loaded with a desired pattern serially from one pin of the overall chip. Similarly, it takes the same amount of time to load the response data from the shift register of the combinational logic block 830. After loading the final vector, the response of the combinational logic block is then captured and analyzed to determine if it is correct.

The combinational logic block 830 contains logic gates 832. The input block 810 and combinational logic block 830 are directly connected. More specifically, the outputs Q of the flip-flops 812 are directly connected to first level gates 834 of the combinational logic block 830. The first level gates 834 can be NAND gates, NOR gates, inverters, XOR gates or any other logic gate used in the combinational logic block 830.

The first switch 836 is connected between each of the first level gates 834 and the supply voltage VDD. The second switch 838 is connected between each of the first level gates 834 and ground. A latch element disposed at the output node 846 of each of the first level gates 834 can contain, as shown, a switching circuit 840 with a pair of back-to-back inverters 842 and a third switch 844. The switches are, for example, NMOS or PMOS transistors or BJTs. The third switch 844 contains both an NMOS and PMOS transistor. All of the switches 836, 838, 844 are controlled by the timing control signal TC or complement timing control signal as described above. When the final vector is supplied to the combinatorial logic block 830 and during normal operation, the supply gating switches 836 and 838 are closed and the switch 844 is open. On the other hand, when an intermediate vector is supplied to the combinatorial logic block 830, the supply gating switches 836 and 838 are open and the switch 844 is closed, so that the output signal is continually resupplied to the output 846 of the first level gate 834. As in the other embodiments, the supply gating switches may be shared.

Figure 9:
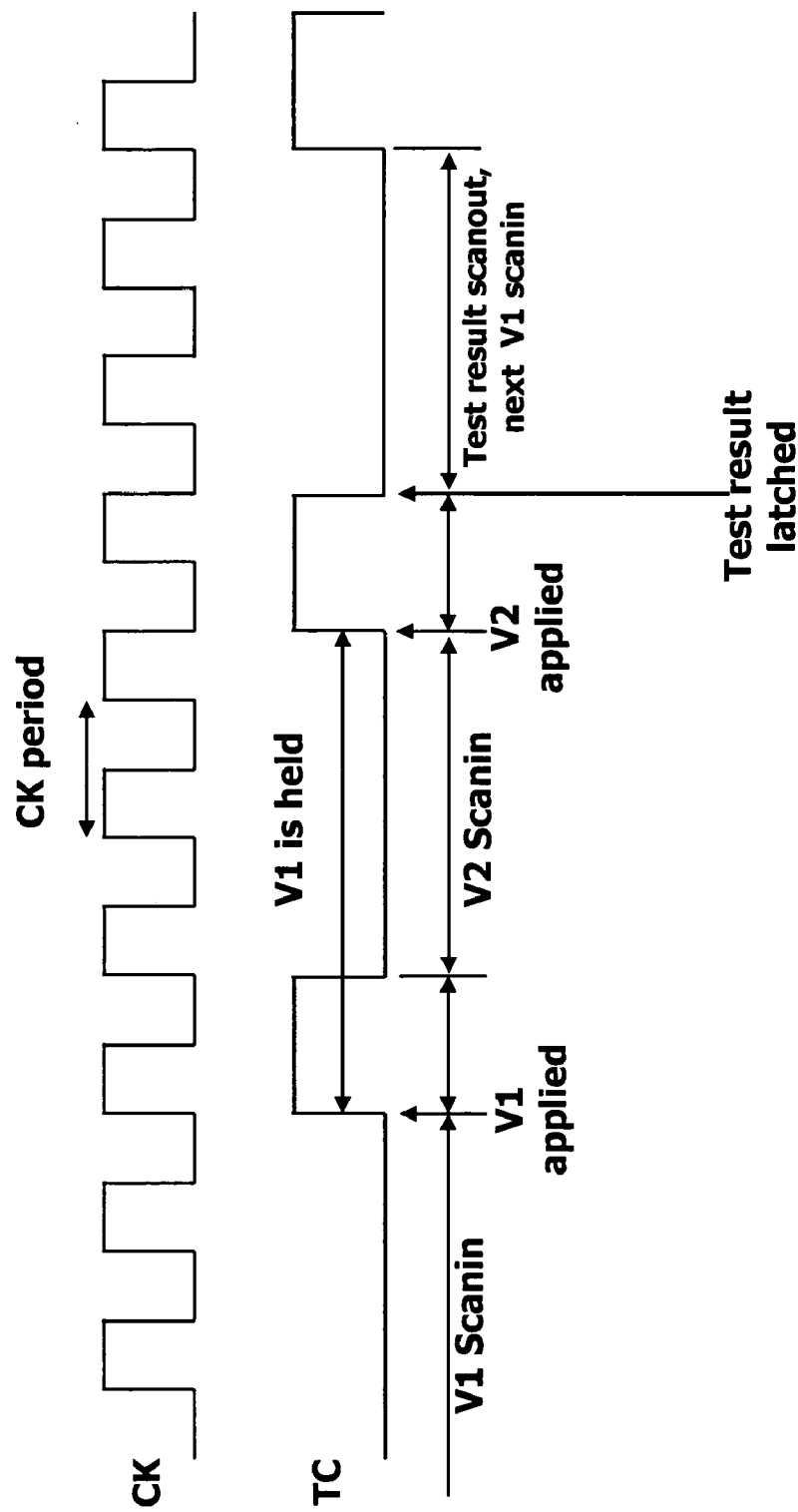
FIG. 9 is a timing diagram for the fourth embodiment.

FIG. 9 is a timing diagram of the embodiment shown in FIG. 8. For a majority of the clock cycles during testing, the timing control signal TC remains in a state in which the output signal of the first level gate is maintained. The timing control signal TC in this state is low as shown, but may be high if the NMOS and PMOS transistors used in the various switches are reversed or if the timing control signals are applied are opposite to that shown in FIG. 8. Before the timing control signal TC switches states, the first vector V1 is loading into the latches in the input block. Once the first vector V1 is completely loaded the timing control signal TC is switched to allow the combinational logic block to respond to the first vector V1 for one clock cycle. The first vector V1 is maintained by the input block during the clock cycle.

At the end of the clock cycle, the timing control signal TC is switched back to maintain the states of the logic gates within the combinational logic block while the second vector V2 is loaded into the latches in the input block. At the same time, the output signal from the combinational logic block is captured using the shift register at the output of the combinational logic block. Accordingly, the number of clock cycles used to capture the response of the combinational logic block to the first vector is same as that used to load the second vector into the input block. The timing diagram is compressed as it may take several thousand clock cycles to load each vector/capture the response to each vector. When the second vector V2 is completely loaded, the timing control signal TC switches for one clock cycle to allow the combinational logic block to respond to the second vector V2. At the end of the clock cycle, the timing control signal TC is switched back to maintain the states of the logic gates within the combinational logic block while the next vector is loaded into the latches in the input block and the response to the second vector V2 is captured. This continues until the response to the final vector is captured and the device reverts to normal mode or an error/diagnostic mode is reached. The error/diagnostic mode may be reached at the end of testing all of the vectors desired if one or more errors are encountered or before all of the desired vectors have been tested if one or more errors are encountered.

Thus, embodiment of FIG. 8 may be used to discern faults in switching from one state to another state. Through modeling of the integrated circuit, all of the possible state changes of the module to be tested can be determined before the integrated circuit is fabricated. All of the possible state changes may be tested or only the most probable state changes may be tested as desired. Unlike the holding block of the prior art however, neither the supply gating switches nor the switching circuit are in the direct signal path through the input block and the combinational logic block. The supply gating switches and switching circuit can be relatively small. Thus, the relatively small supply gating switches and switching circuit use less area, delay and power overhead than the holding block, which is a fairly large circuit.

The delay of the circuit of FIG. 7 becomes very close to the delay without the additional transistors as the size of the supply gating transistors is increased. Beyond a size of five times of minimum transistor size for the supply gating transistor, there is not much reduction in delay by increasing the size. The delay overhead is due to the increased capacitive load at output of the first level gates and extra resistance in the charge/discharge paths of these gates. The power is not dependent on the size of the gating transistors. This is because these transistors are already 'ON' in the normal mode and their associated parasitic capacitances are already discharged (for NMOS) or charged (for PMOS). Therefore, enlarging of the gating transistor size for delay improvement has no power penalty. The power is very close to the original circuit power. The only source of power overhead is due to switching of the minimum-sized inverters and the diffusion capacitance added to the outputs of the first level gates due to the transmission gate.

Figure 10:
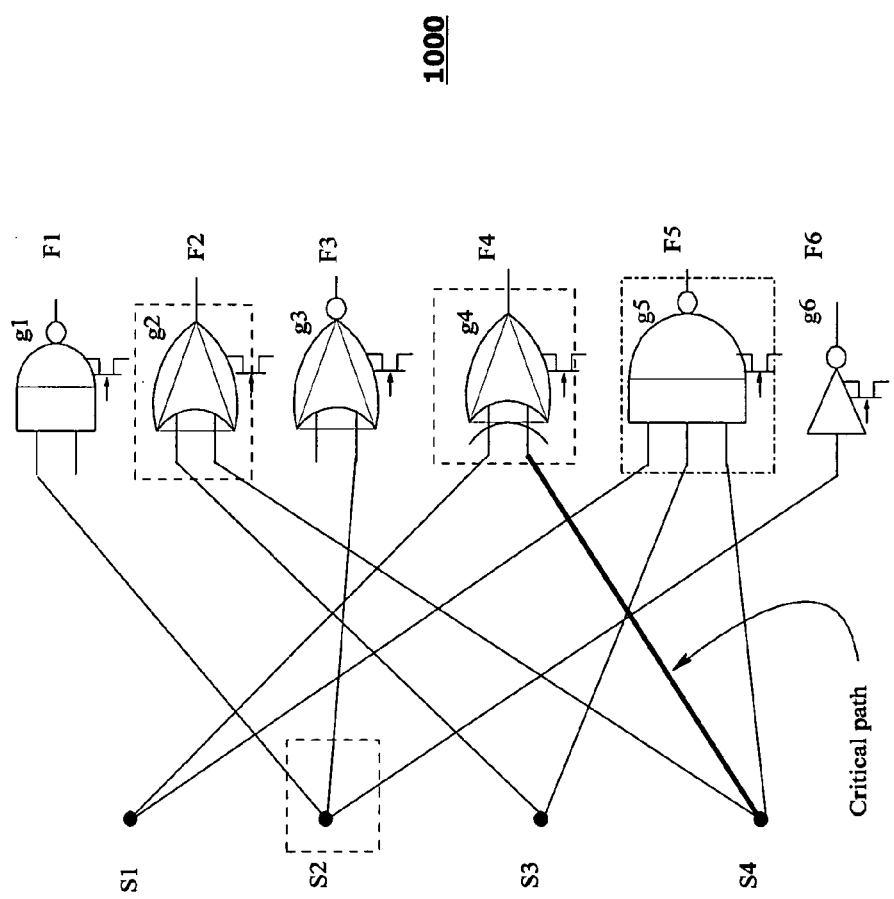
FIG. 10 is a set of non-minimized first level gates.

While the arrangement of FIG. 7 may consume more power in the scan chain during test mode than other arrangements, the energy saving in normal mode far outweighs the power overhead in the scan chain during testing. To further reduce area and power overhead without increasing delay overhead, the number of first level gates can be reduced. This reduces the number of supply gating transistors. FIG. 10 illustrates a set of first level gates g1 to g6 in a combinational logic block 1000 and the signal paths of signals S1 to S4 from the input block (not shown). Signal S2 is outlined to show that it is has a fanout of three first level gates, that is, it is supplied to three different first level gates g1, g3 and g6 in the set of first level gates g1 to g6. Since the area and power overhead is proportional to the number of unique fanouts, the overhead can be reduced by optimizing the number of direct fanouts of the latches in the input block. The number of fanouts of a latch is not generally allowed to be large, since it affects capacitive load at the output of the latch and, hence, increases propagation delay. Circuits are usually are designed targeting overall area minimization or fanout optimization to minimize delay under area constraint or to meet a delay constraint with minimum area overhead.

Figure 1:
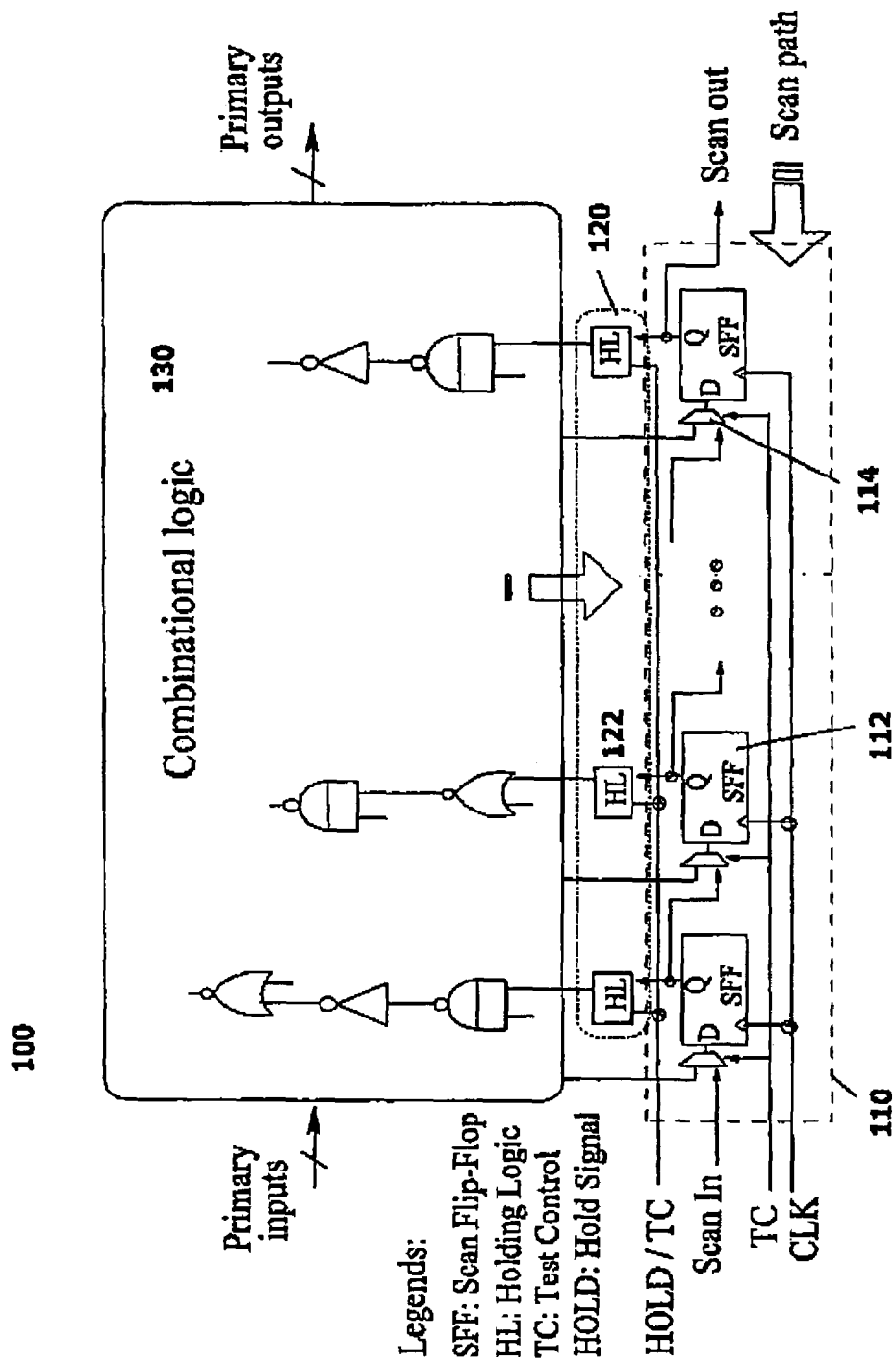
FIG. 1 is a known circuit used during testing of a combinational logic block.

However, as shown in FIG. 1, the number of first level gates in the set of first level gates g1 to g6 in a combinational logic block 1100 and the signal paths of signals S1 to S4 from the input block (not shown) are reduced. A pair of inverters INV1 and INV2 has been added between the signal S2 and the former first level gates g1 to g6. This reduces the overall number of first level gates.

Figure 12:
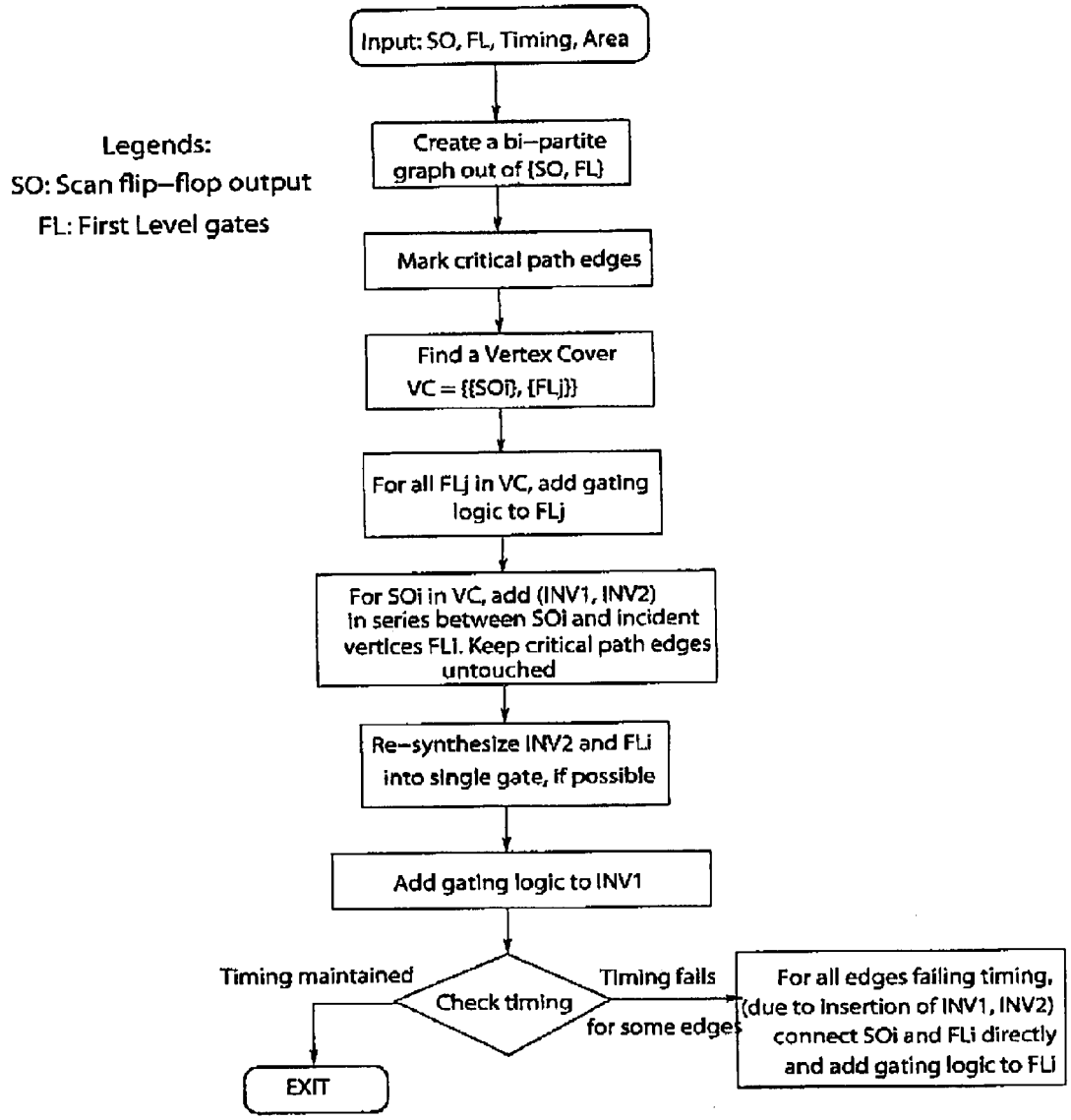
FIG. 12 is a fanout algorithm used to minimize the number of first level gates.

An algorithm that may be used to reduce the fanout and which targets minimization of first level gates on a critical path time (i.e. the longest path through the circuit) is shown in FIG. 12. The algorithm 1200 is based on finding the minimal vertex cover of a bi-partitite graph. A vertex cover of a graph is a set of vertices (nodes) which covers all the edges. That is, every edge is incident to at least one vertex in the set. A bi-partitite graph is a set of graph vertices decomposed into two disjoint sets such that no two graph vertices within the same set are adjacent. Two inverters are then added in series at the output of selected latches of the input block.

As shown in FIG. 12, the outputs of the input block latches SO, first level gates FL, timing and area constraints are input 1202. An undirected bi-partitite graph G is created with the output of the latches SO and the first level gates FL as vertices 1204. The edges in the graph G correspond to the logic paths from the latches to the first level gates FL. Critical path edges are marked in the graph 1206. An approximate solution of the vertex cover problem (vertex cover VC={{$SO_i$}, {$FL_j$}}) is determined for the graph G using a greedy heuristic-based solution of linear complexity 1208. A greedy solution is that which takes the best immediate, or local, solution. The latch SO vertices that have a single fanout are identified and the incident first level gates FL vertex is selected. The first level gate FL vertices are chosen into the vertex cover VC one at a time in decreasing order of degree of the vertices and all their incident edges are removed from the graph G. Those first level gate FL nodes with a high degree (i.e. large number of incident edges, say 3 or more) and the ones corresponding to critical path edges are chosen. The incident edges of all first level gate FL nodes selected in the vertex cover VC are removed from the graph and the latch SO vertices with remaining degree greater than 0, are selected into the vertex cover VC. Gating logic is added to all first level gates $FL_j$ in the vertex cover VC 1210.

Two inverters INV 1, INV 2 are added to all the latches $SO_i$ in the vertex cover VC 1212. The output of the second inverter INV2 to all the first level gates FL adjacent to the latches $SO_i$ and not in the vertex cover VC are connected. Re-synthesization of the second inverter INV2 and the following first level gates is attempted for reducing the area/delay penalty 1214. For example, if the first latch $SO_1$ and the second latch $SO_2$ are connected to an OR gate, and both are in the vertex cover VC, then the second inverter INV2 can be re-synthesized with the OR gate to generate a NAND gate with about one third of the delay/area of the second inverter INV2 and the OR gate. However, delay or area improvement with re-synthesis largely depends on the circuit topology. If a latch is already connected to an inverter, it is treated as the first inverter INV 1. Although additional inverters may introduce extra delay, reduction of output load of the input latches due to lesser fanouts induces a positive impact on delay. Gating logic is added to all first level gates $FL_j$ in the vertex cover VC and to all first inverters INV1, which become the new first level gates 1216. The timing is then checked 1218. If the timing is maintained, the algorithm is finished 1220. To ensure that a delay constraint is met, inverters are removed from those paths that violate the delay constraint and their incident first level gate FL nodes are added directly to the vertex cover VC 1222. That is, if the timing check determines that the timing fails for at least one edge due to the insertion of the first and second inverters INV 1 and INV2, the latch outputs $SO_i$ and first level gates $FL_i$ are connected directly and gating logic is added to the first level gates $FL_i$.

Figure 11:
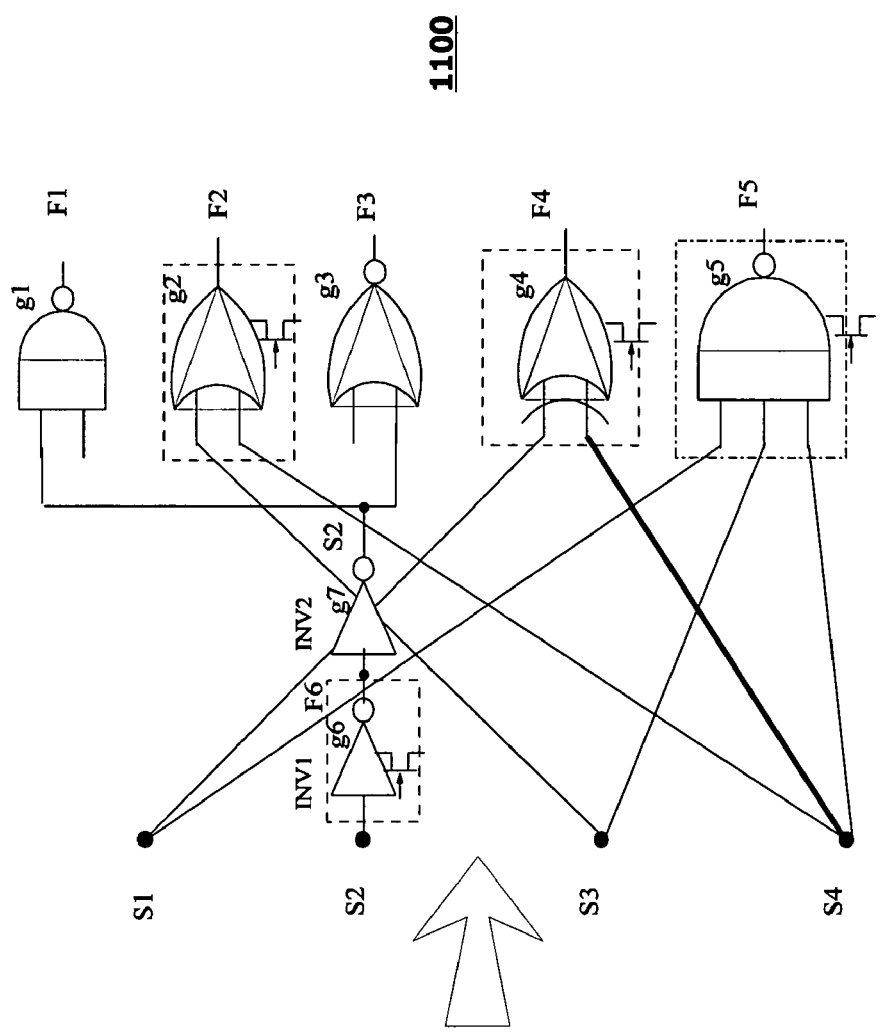
FIG. 11 is a set of minimized first level gates.

Using FIGS. 10 and 11 as an example to illustrate this, the outputs s1 to s4 of four input block latches and six first level gates g1 to g6 are shown. The critical path edge is marked in bold. Before fanout reduction, gating logic is applied to all six fanout gates g1 to g6. A bi-partitite graph is created and the vertex cover determined, as illustrated by dashed boxes. Two inverters INV1 and INV2 are added in series to the output s2 in the vertex cover VC such that the timing constraint is not violated. Gating logic is added to the new first level gates, the number of which is reduced to four.

In summary, power dissipation during test mode can be significantly higher than that during functional mode, which if minimized can increase battery lifetime in hand-held electronic devices which periodically self-test. In addition, increased power is likely to create noise problems in a chip by causing a drop in the supply voltage. Peak and average power reduction during test contributes to enhance reliability of test and to improve yield.

By adding transistors or other circuitry to first level gates within a combinational logic block, a circuit is provided with minimal power dissipation, substrate area and/or delay. During testing, power dissipation in the combinational logic block due to the effect of intermediate vectors propagating to the combinational logic block and redundant switching is minimized. Propagation of the effect of the intermediate vectors are blocked. Additionally, significant delay in the signal propagation path from the input block is avoided as well as power overhead in normal operation of the circuit and leakage power is reduced.

The first level gates of the combinational logic block are directly connected to an input block through which vectors are latched to the combinational logic block. During testing, each first level gate has one or more switches that disconnect the first level gate from the power supply voltage and/or ground in a hold mode. The output of each first level gate can be grounded or connected to the power supply voltage when intermediate vectors are loaded into the latches to minimize power consumption. Alternatively, the output may be latched to itself to refresh the signal on the output until the final vector to be tested is loaded. When the final vector is loaded, the first level gates are reconnected connected to the power supply and/or ground while the outputs of the first level gates are responsive to the signals supplied to the inputs of the first level gates. The additional circuitry thus prevents propagation of switching though the combinational logic block during the hold times.

Since just one transistor may be introduced in the charge/discharge path of the first level gates in the combinational logic block, the delay penalty is relatively small compared to other methods of eliminating the propagation, which insert additional level of logic into signal propagation path. The area overhead is also reduced compared to other methods as the area overhead depends on number of unique first level fanout gates, which is decreased under delay constraint and further reduces the area overhead.

It is therefore intended that the foregoing detailed description be regarded as illustrative rather than limiting, and that it be understood that it is the following claims, including all equivalents, that are intended to define the spirit and scope of this invention.

The invention claimed is:

1. A circuit containing a logic block under testing, the circuit comprising:
an input block containing a plurality of latches, the latches connected serially such that an output of one of the latches is connected to an input of a successive latch; and
a combinatorial logic block containing a plurality of logic gates, the plurality of logic gates including first level gates connected to the input block, at least one of the first level gates containing:
a first switch between the first level gate and either a supply voltage or ground; and
a switching circuit connected to an output of the first level gate, the switching circuit including a second switch.

2. The circuit of claim 1, wherein the second switch is connected between the output of the first level gate and either the supply voltage or ground.

3. The circuit of claim 2, wherein the first and second switches are connected to different voltages.

4. The circuit of claim 3, wherein the first and second switches are active at different times and inactive at different times.

5. The circuit of claim 1, wherein a plurality of the first level gates contain a first switch and a switching circuit, and a plurality of the first switches are connected together to the supply voltage or ground.

6. The circuit of claim 1, wherein the first level gates are directly connected to the input block.

7. The circuit of claim 1, wherein the second switch is closed at testing times other than when a final test vector is supplied to the combinatorial logic block.

8. The circuit of claim 1, wherein the switching circuit further comprises a delay in series with the second switch, an input and an output of the switching circuit connected to the output of the first level gate.

9. The circuit of claim 8, wherein the delay comprises a pair of inverters.

10. The circuit of claim 1, further comprising a third switch between the first level gate and either the supply voltage or ground, the first and third switches connected to different voltages.

11. The circuit of claim 10, wherein the first and third switches are active at substantially the same first time and inactive at substantially the same second time.

12. The circuit of claim 1, wherein the combinatorial logic block is designed to have a minimum number of first level gates to obtain all desired output signals from the combinatorial logic block in response to input signals supplied to the combinatorial logic block.

13. A circuit containing a logic block under testing, the circuit comprising:
an input block containing a plurality of latches, the latches connected serially such that an output of one of the latches is connected to an input of a successive latch; and
a combinatorial logic block containing a plurality of logic gates, the plurality of logic gates including first level gates connected to the input block, at least one of the first level gates containing means for providing a virtual ground and virtual power supply to the first level gate and means for delaying a signal from an output of the first level gate and resupplying the signal to the output of the first level gate at testing times other than when test signals are provided from the combinatorial logic block.

14. The circuit of claim 13, wherein the providing means and delaying means are active at substantially the same first time and inactive at substantially the same second time.

15. The circuit of claim 13, wherein the combinatorial logic block is designed to have a minimum number of first level gates to obtain all desired output signals from the combinatorial logic block in response to input signals supplied to the combinatorial logic-block.

16. The circuit of claim 13, wherein the first level gates are directly connected to the input block.

17. A circuit containing a logic block under testing, the circuit comprising:
an input block containing a plurality of latches, the latches connected serially such that an output of one of the latches is connected to an input of a successive latch; and
a combinatorial logic block containing a plurality of logic gates, the plurality of logic gates including first level gates connected to the input block, at least one of the first level gates containing:
first means for providing at least one of a virtual ground and virtual power supply to the first level gate, and
second means for providing the virtual ground or virtual power supply to an output of the first level gate.

18. The circuit of claim 17, wherein the first and second means provide different voltages.

19. The circuit of claim 18, wherein the first and second means are active at different times and inactive at different times.

20. The circuit of claim 17, wherein a plurality of the first level gates contain the first and second means, and a plurality of the first means are connected together.

21. The circuit of claim 17, wherein the first level gates are directly connected to the input block.

22. The circuit of claim 17, wherein the combinatorial logic block is designed to have a minimum number of first level gates to obtain all desired output signals from the combinatorial logic block in response to input signals supplied to the combinatorial logic block.

23. A method of testing a logic block, the method comprising:
sequentially loading a sequence of signals to a plurality of latches in an input block;
providing the sequence to first level gates in a combinatorial logic block from the input block once the sequence is completely loaded into the latches; and
at times other than when the sequence is completely loaded, disconnecting at least one first level gate of the combinatorial logic block from at least one of ground and a power supply voltage while providing a predetermined voltage to an output of the first level gate.

24. The method of claim 23, wherein providing the predetermined voltage comprises grounding or providing the power supply voltage to the output of the first level gate.

25. The method of claim 23, wherein the predetermined voltage is not provided to the output of the first level gate when the disconnected ground is reconnected to the first level gate or the disconnected power supply voltage is reconnected to the first level gate.

26. The method of claim 24, further comprising disconnecting the ground or power supply voltage to a plurality of first level gates and providing predetermined voltages to outputs of the first level gates, and disconnecting a set of the first level gates from ground or the power supply voltage using a single connection.

27. The method of claim 24, wherein the first level gates are directly connected to the input block.

28. The method of claim 24, further comprising designing the combinatorial logic block to have a minimum number of first level gates to obtain all desired output signals from the combinatorial logic block in response to input sequences supplied to the combinatorial logic block.

29. The method of claim 24, further comprising permitting the output signal from the output of the first level gate to respond to a signal supplied to an input of the first gate level when the sequence is fully loaded.

30. The method of claim 23, further comprising disconnecting both ground and power supply voltage, wherein providing the predetermined voltage comprises delaying an output signal from an output of the first level gate, and providing the delayed output signal back to the output of the first level gate.

31. The method of claim 30, further comprising electrically disconnecting the delayed output signal from the output when the sequence is fully loaded.

32. A method of testing a logic block, the method comprising:
sequentially loading a sequence of signals to a plurality of latches in an input block;
providing the sequence to first level gates in a combinatorial logic block directly from the input block once the sequence is completely loaded into the latches;
preventing propagation through the combinatorial logic block of input signals from the input block before the sequence is completely loaded; and capturing output signals from the combinatorial logic block once the sequence is provided to the first level gates.

33. The method of claim 32, further comprising preventing propagation by disconnecting each first level gate from either ground or a power supply voltage and connecting an output of the first level gate to the other of ground or the power supply that has not been disconnected.

34. The method of claim 33, further comprising disconnecting a set of the first level gates from ground or the power supply voltage using a single connection.

35. The method of claim 32, wherein the first level gates are directly connected to the input block.

36. The method of claim 32, further comprising designing the combinatorial logic block to have a minimum number of first level gates to obtain all desired output signals from the combinatorial logic block in response to input sequences supplied to the combinatorial logic block.

37. The method of claim 32, further comprising disconnecting each first level gate from both ground and a power supply voltage, delaying an output signal from an output of the first level gate, and providing the delayed output signal back to the output of the first level gate.

38. A system containing a logic block under testing, the system comprising:
an input block containing a plurality of latches, the latches connected serially such that an output of one of the latches is connected to an input of a successive latch;
a combinatorial logic block containing a plurality of logic gates, the plurality of logic gates including first level gates connected to the input block, a plurality of the first level gates having at least one first switch through which the first level gates are disconnected from a supply voltage and ground, the first level gates each having a switching circuit connected to an output of the first level gate and including a second switch;
a clock circuit that supplies a clock signal to the input block;
a timing control circuit that supplies a control signal to the input block and the combinatorial logic block, the control signal controlling the first and second switches; and
a detector to capture an output from the combinatorial logic block in response to a predetermined sequence of signals supplied from the latches to the combinatorial logic block.

39. The system of claim 38, wherein the first level gates are directly connected to the input block.

40. The system of claim 38, wherein each second switch is connected between the output of the first level gate and either the supply voltage or ground, the first and second switches are connected to different voltages.

41. The system of claim 38, wherein at least some of the first level gates are disconnected from ground or the power supply voltage using a single connection.

42. The system of claim 38, wherein each switching circuit further comprises a delay in series with the second switch, an input and an output of the switching circuit are connected to the output of the first level gate, each first level gate further comprises a third switch between the first level gate and either the supply voltage or ground, and the first and third switches are connected to different voltages.

43. The system of claim 38, wherein the combinatorial logic block is designed to have a minimum number of first level gates to obtain all desired output signals from the combinatorial logic block in response to input signals supplied to the combinatorial logic block.

44. A circuit containing a logic block under testing, the circuit comprising:
an input block containing a plurality of latches, the latches connected serially such that an output of one of the latches is connected to an input of a successive latch; and
a combinatorial logic block containing a plurality of logic gates, the plurality of logic gates including first level gates connected to the input block, at least one of the first level gates containing means for preventing propagation of input signals from the input block through the combinatorial logic block.

45. The circuit of claim 1, wherein the input block contains a multiplexer connected to each of the plurality of latches.

46. The circuit of claim 13, wherein the input block contains a multiplexer connected to each of the plurality of latches.

47. The circuit of claim 17, wherein the input block contains a multiplexer connected to each of the plurality of latches.

48. The method of claim 23, further comprising providing a multiplexer connected to each of the plurality of latches in the input block.

49. The method of claim 32, further comprising providing a multiplexer connected to each of the plurality of latches in the input block.

50. The system of claim 38, wherein the input block contains a multiplexer connected to each of the plurality of latches.

51. The circuit of claim 44, wherein the input block contains a multiplexer connected to each of the plurality of latches.

* * * * *